United States Patent

Shimoda et al.

[11] Patent Number: 4,710,746
[45] Date of Patent: Dec. 1, 1987

[54] SEQUENTIAL DECODING DEVICE FOR DECODING SYSTEMATIC CODE

[75] Inventors: Kaneyasu Shimoda; Tadayoshi Katoh, both of Kawasaki; Yuzo Ageno, Yokohama, all of Japan

[73] Assignee: Fujitsu Limited, Kawasaki, Japan

[21] Appl. No.: 11,537

[22] Filed: Feb. 6, 1987

[30] Foreign Application Priority Data

Feb. 7, 1986 [JP] Japan ................................. 61-023972

[51] Int. Cl.$^4$ ........................................... H03M 13/12
[52] U.S. Cl. ................................. 340/347 DD; 371/43
[58] Field of Search ................. 340/347 DD; 371/43, 371/44, 45

[56] References Cited

U.S. PATENT DOCUMENTS

3,457,562  7/1969  Fano ........................... 340/347 DD
4,583,078  4/1986  Shenoy ........................ 340/347 DD

Primary Examiner—Charles D. Miller
Attorney, Agent, or Firm—Staas & Halsey

[57] ABSTRACT

A sequential decoding device for decoding a data expressed by a systematic code having a symbol memory, a maximum likelihood path decision circuit, and a path memory, includes: an overflow detection circuit for detecting an overflow of the symbol memory, and a switch for supplying signal bit data, as an decoded output, read from the symbol memory directly to the path memory in correspondence with an overflow detection signal from the overflow detection circuit. The device includes further a path metric value increase/decrease monitoring circuit for monitoring the increase/decrease of a path metric value delivered from the maximum likelihood path decision circuit and controlling the switch in such a manner that, when a monotonous increase of path metric value is detected, the decoded output of the maximum likelihood path decision circuit is supplied to the path memory instead of a direct supply of the decoded output of the symbol memory to the path memory.

1 Claim, 7 Drawing Figures

Fig. 2

Fig. 3
GENERATION OF SYSTEMATIC CODE

Fig. 4

GENERATION OF PARITY BIT

| SIGNAL TO BE TRANSMITTED | A | B | C | PARITY BIT |
|---|---|---|---|---|
| 0 0 1 1 1 0 1 (0) | 1 | 0 | 0 | 1 |
| 0 0 0 1 1 1 0 1 (0) | 0 | 1 | 0 | 1 |
| 0 0 0 0 1 1 1 0 1 (0) | 1 | 0 | 0 | 1 |
| 0 0 0 0 0 1 1 1 0 1 (1) | 1 | 1 | 1 | 1 |
| 0 0 0 0 0 0 1 1 1 (0) 1 | 1 | 1 | 0 | 0 |
| 0 0 0 0 0 0 0 1 1 (1) 0 1 | 0 | 1 | 1 | 0 |
| 0 0 0 0 0 0 0 0 1 (1) 1 0 1 | 0 | 0 | 1 | 1 |

SEQUENTIAL DECODING DEVICE FOR DECODING SYSTEMATIC CODE

BACKGROUND OF THE INVENTION

1. Field of the Invention

The present invention relates to a sequential decoder for decoding a systematic code.

The systematic code is composed of signal bits and the parity bits formed from the signal bits. In the sequential decoding for decoding the systematic code, a path metric value of one path in a tree-formed code and the received code sequence is calculated, and when the path metric value surpasses a certain threshold value, the data bits are decoded. When the path metric value does not reach a certain threshold value, it is regarded as having entered an erroneous path and a search is made for a correct path, and the data bits in the correct path are decoded.

2. Description of the Related Arts

The sequential decoding system for error correction in convolutional codes is a decoding system for error correction which estimates the most likely decoded data sequence by a trial and error method. In an ideal condition, the decoding system can obtain a correct decoded data sequence as accurately as with a maximum likelihood decoding (Viterbi decoding). This system differs from the maximum likelihood decoding in that, if the constraint length of the convolutional code is lengthened, the circuit scale of decoders is not remarkably enlarged, and thus is advantageous in that the use of a code having a long constraint length enables an improved error correction performance to be obtained by using a long constraint length. Accordingly, this system is specifically suited for use in a satellite communication system or a space probe and the like.

A Fano algorithm is well known in actual sequential decoding, but the Fano sequential decoder has an unavoidable problem in that a degradation of the quality of the channels and an increase of errors cause an increase in the repetition rate of a trial and error method and reduce the decoding speed, and accordingly, the concentration of errors at the channel causes a buffer overflow and delays the decoding.

SUMMARY OF THE INVENTION

It is the object of the invention to provide an improved sequential decoding device which can prevent the overflow of a symbol memory and obtain a continuous decoding processing, to reduce the storage capacity and realize an economical structure of the device.

According to the present invention, there is provided a sequential decoding device for decoding data expressed by a systematic code, having a symbol memory, a maximum likelihood path decision circuit, and a path memory, said device comprising:

an overflow detection circuit for detecting an overflow of said symbol memory;

switching means for supplying signal bit data, as an decoded output, read from said symbol memory directly to said path memory in correspondence with an overflow detection signal from said overflow detection circuit; and a path metric increase/decrease monitoring circuit for monitoring an increase/decrease of a path metric value delivered from said maximum likelihood path decision circuit and controlling said switching means in such manner that, when a monotonous increase of said path metric value is detected, the decoded output of said maximum likelihood path decision circuit is supplied to said path memory, instead of the direct supply of the decoded output of said symbol memory to said path memory.

When an overflow of the symbol memory which stores the received symbol is detected by an overflow detector circuit, the error-rich symbol section is skipped by a switching portion to output a signal bit for which the error correction is not carried out, as a demodulation signal. When the monotonous increase of the path metric value of the maximum likelihood path decision circuit is detected, a transition may be executed from a skip state to a normal state, in which the demodulation signal due to the error correction can be selectively output. Based upon the skip operation of the error concentrated section of the received symbol, the overflow of the symbol memory is avoided.

Moreover, due to the excess processing of a write operation and the extinction of data to be read, i.e., an impossible attempt to continue the demodulation processing, can be evaded. Accordingly, the storage capacity of the symbol memory may be made comparatively small and an economical constitution can be realized.

DESCRIPTION OF THE PREFERRED EMBODIMENTS

To enable a clearer understanding of the present invention, the operation of the convolutional encoder and sequential decoding and its associated techniques will be described hereinafter with reference to FIGS. 1 to 5.

Figure 1:
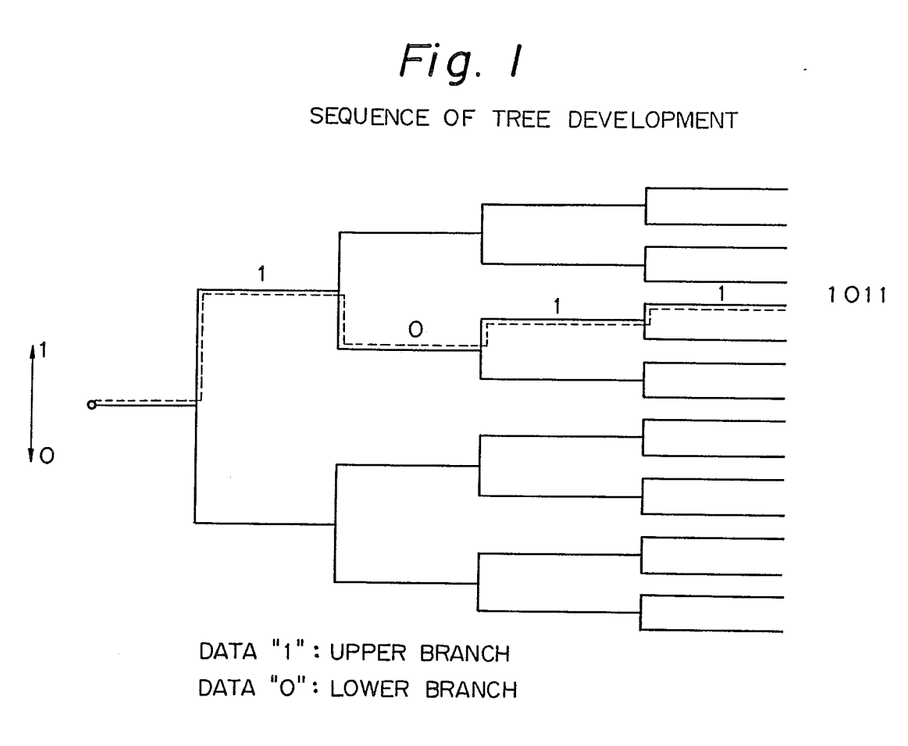
FIG. 1 is a diagram of a sequence of tree development in a logic tree searching as the basis of the device according to the present invention.

FIG. 1 is an explanatory diagram showing a sequence of tree development. Suppose that data is "1" at an upper branch and data is "0" at a lower branch, then by starting from a node and ending at a final node, the sequence of a branch development is, for example, data 1011, as shown by the dotted line. In a tree-code search method, the convolutional encoder input may be regarded as a set of instructions that direct the transmitter along a path through the code tree. The concept of sequential decoding is to program the decoder to act in much the same way as for example, a driver who occasionally makes a wrong choice at a fork in the road but quickly discovers the error, and thus goes back and tries the other fork.

Figure 2:
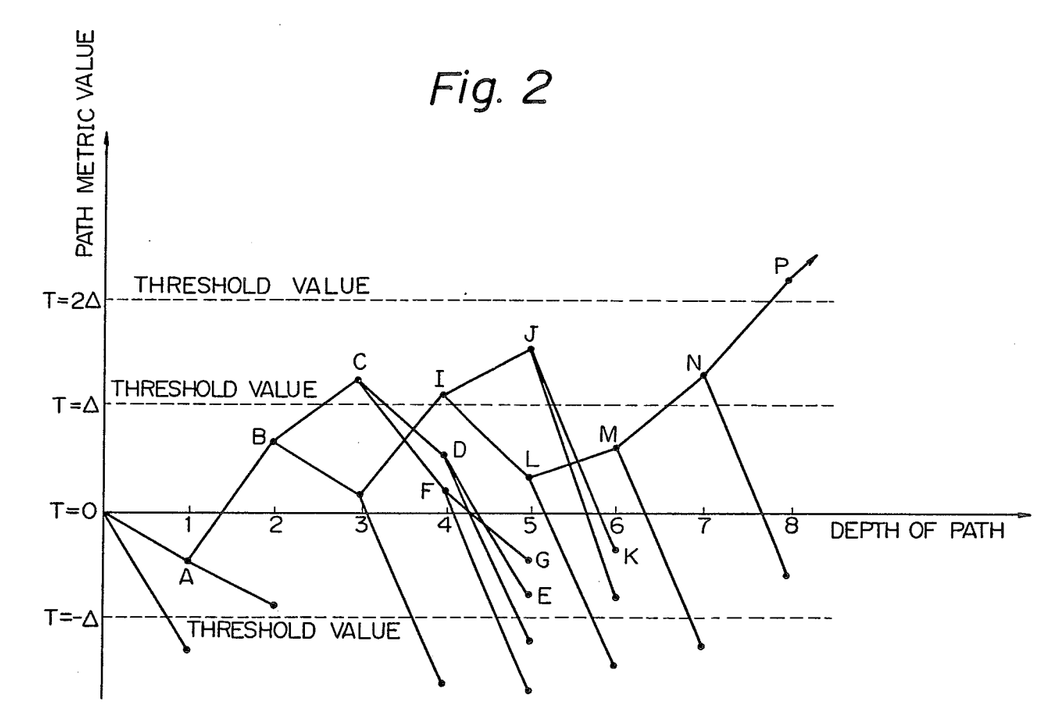
FIG. 2 is a diagram of a path search in a logic tree searching with a Fano algorithm, used in the device according to the present invention.

FIG. 2 is a diagram showing a path search in a tree-code search with a Fano algorithm. In general, in response to a basic flow diagram for the Fano algorithm, which has a forward loop and a search loop, a tree-code search is devised to find the best path from the tree-code reception value.

(1) At a certain node, when the threshold value is smaller than the path metric or equal to the path metric value, the node is referred to as the node that satisfies a threshold value, and when the threshold value is greater than the path metric value, the node is referred to as the node that does not satisfy a threshold value.

(2) A threshold value T starts from zero. As an algorithm proceeds further, the threshold value is changed by an integral number of multiplication with an increment $\Delta$ of a predetermined constant. In FIG. 2, the nodes C, I, J, N satisfy the threshold value $T=\Delta$, but the nodes A, G, E, K do not satisfy the threshold value $T=0$.

(3) The node being searched by a demodulator is indicated by a search pointer at that time. The search pointer is not set at a node which does not satisfy the threshold value.

(4) The threshold value is referred to as "enhanced", when the increment $\Delta$ is increased as much as possible in order that the path metric of the nodes may satisfy the threshold value at the instant point of time.

(5) The threshold value is enhanced, only when the search pointer moves to the nodes by which have not been indicated previously.

(6) In the Fano algorithm, when the nodes are searched, the branch metric value is calculated and the accumulated metric at the node is also calculated to compare it with the threshold value. The node is searched when it forwards and also it goes back.

Next, the decoder operation will be described in detail.

Sequential decoding is a procedure for systematically searching through a code tree, using received information as a guide, with the objective of eventually tracing out a path representing the acutally transmitted information sequence.

Most sequential decoder implementations to data use a modification of the Fano algorithm. Briefly, the operation of the Fano algorithm is as follows. Starting at the first node in the code tree, a path is traced through the tree by moving ahead one node at a time. At each node encountered, the decoder evaluates a branch metric value for each branch stemming from that node. The branch metric value is a function of the transition probabilities between the received symbols and the transmitted symbols along the hypothetical branch.

The decoder will initially choose the branch with the largest metric value corresponding to the closest match with the received symbols. The metric value is then added to a path metric value, which is the running sum of the branch metric values along the path presently being followed. Together with the path metric value the decoder keeps track of the running threshold value T. As long as the path metric value continues to increase, the decoder assumes that it is on the right track and continues moving forward, raising the value T to within a fixed constant $\Delta$ below the path metric value. If, on the other hand, the path metric value decreases at a particular node, such that it becomes less than the T value, the decoder assumes it has made a mistake and backs up, and then systematically searches for nodes having a path metric value greater than the T value, until it finds a path at which the metric is increasing, or until it exhausts all nodes lying above the value T. At this point, the decoder is forced to lower the T value and search again. Eventually, the decoder will find a path that appears to have an increasing path metric value, and the decoder will then penetrate the tree sufficiently that there is a high probability that the first few branches followed are correct and will not be returned to by the decoder in a reverse search. At this point, the information bits corresponding to these branches can be considered decoded, and the decoder outputs received data pertaining to these branches.

Figure 3:
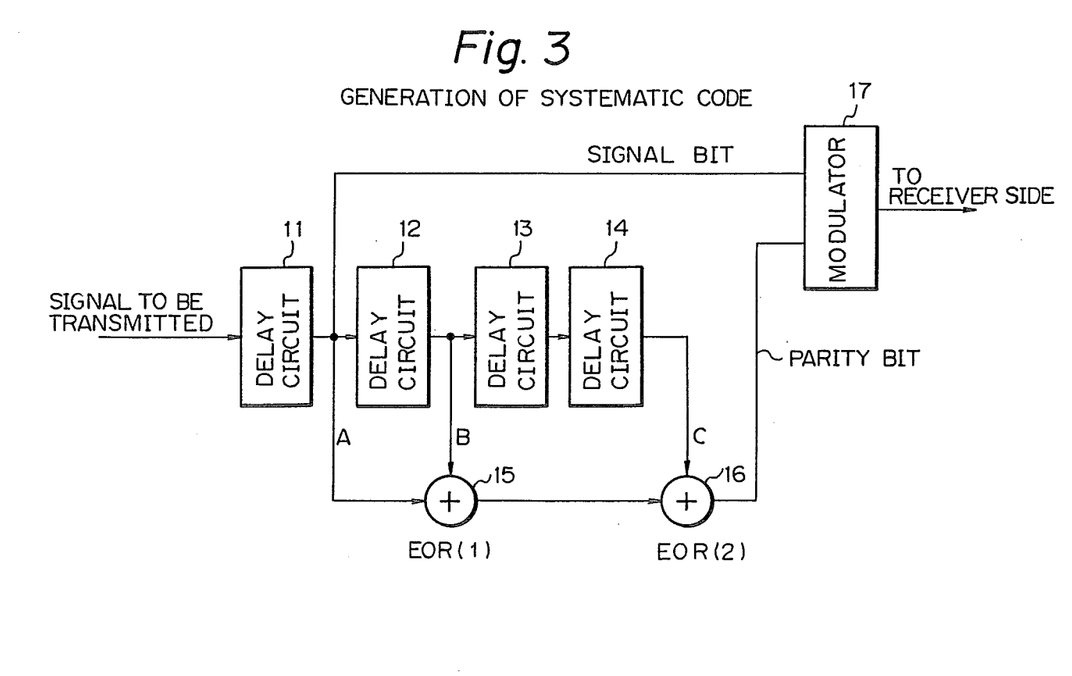
FIG. 3 is a diagram showing the generation of the systematic code.

FIG. 3 is a block diagram of a systematic encoder. A systematic code is formed by an encoder as shown in FIG. 3, wherein the coding rate is $R=\frac{1}{2}$ and to constraint length of a code is $K=4$. A signal to be transmitted is applied in turn to delay circuits 11 to 14. The signal to be transmitted through the first delay circuit 11 is a signal bit and the outputs of a first delay circuit 11 and the second delay circuit 12 are applied to a first adder 15 of the modulo-2, i.e., to a first exclusive OR circuit EOR (1), and the output of the first EOR (1) and the output of a fourth delay circuit 14 are applied to a second adder 16 of modulo-2, i.e., to a second exclusive OR circuit EOR (2).

The output operated by the first EOR (1) and/or the second EOR (2) is a parity bit, and the signal bit and the parity bit are transmitted to the receiver side as a transmitted signal by means of an orthogonal modulation or the like through a modulator 18.

Figure 4:
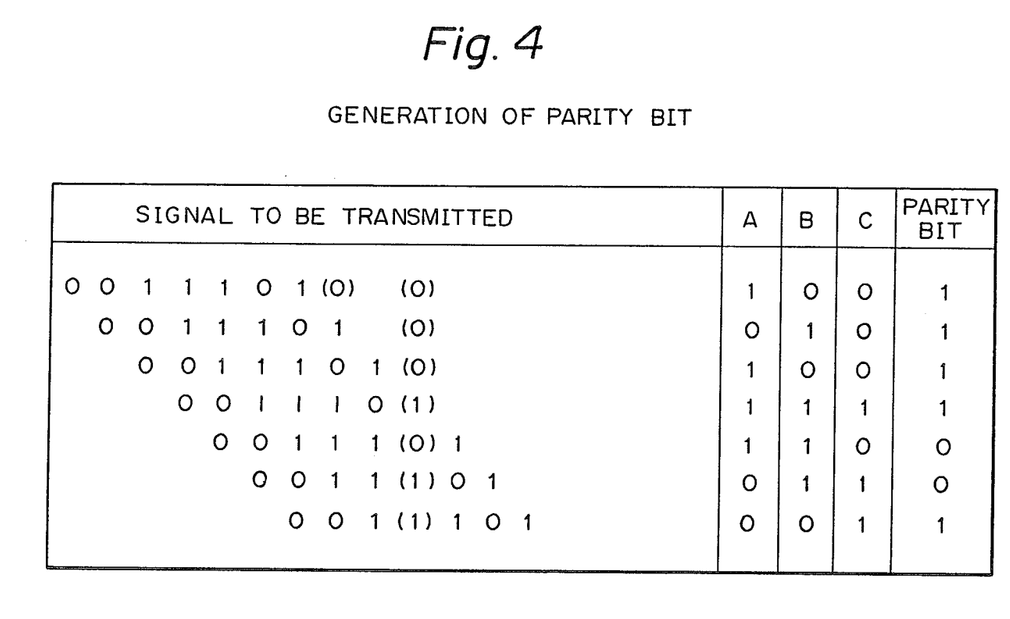
FIG. 4 is a diagram of an example of the generation of a parity bit.

FIG. 4 is an explanatory diagram showing an example of the generation of a parity bit.

Figure 5:
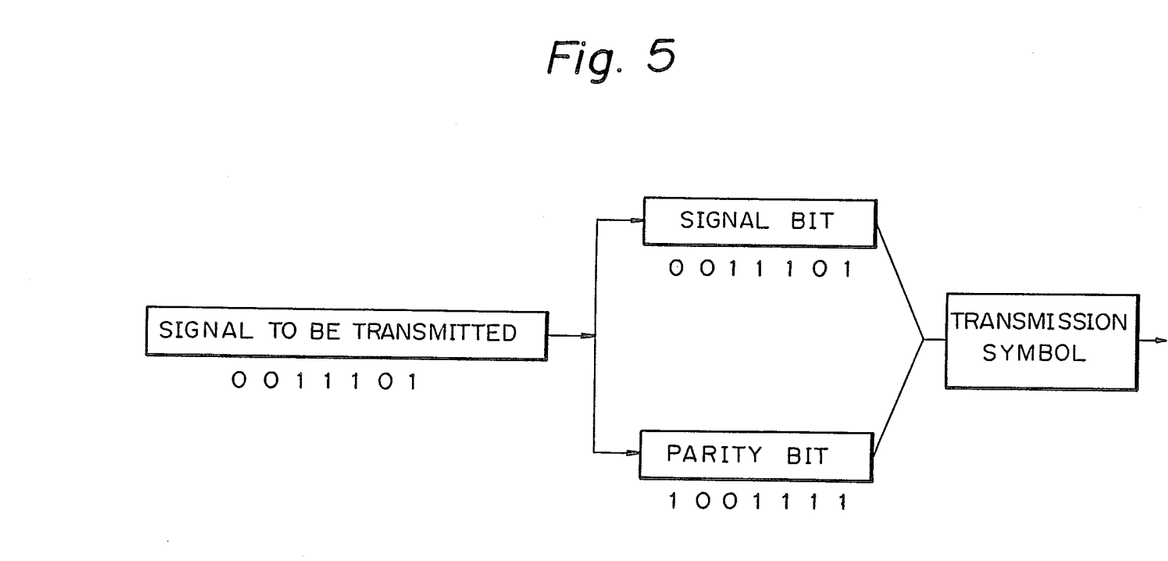
FIG. 5 shows an example of a systematic code encoded by an encoder.

FIG. 5 is an explanatory diagram showing a systematic code, when encoded by the above-described encoder. If a signal "1011100—" to be transmitted is input in turn to the delay circuit 11 in the direction shown by an arrow, the signal bit is "1011100—", which is the same as the above-noted signal to be transmitted. If the output of the delay circuits 11 to 14 is "0" in an initial state, the first additive output in which both the outputs of delay circuits 11 and 12 are added by an adder 15, plus the output of a delay circuit 14 are added by an adder 16 and a second additive output "1111001—" is produced. The signal bit and parity bit are transmitted by means of an orthogonal modulation or the like.

At the receiving side, since the received modulating wave is modulated, for example, the in-phase channel responds to the signal bits and the orthogonal channel to the parity bits. The receiving symbol is stored in turn in a symbol memory. The maximum likelihood path is determined by a maximum likelihood decision circuit. When a path metric value surpasses a certain threshold value, it is determined to be a right path and after decoding it is stored in a path memory.

When a path metric value does not reach a threshold value, it is determined to be an erroneous path, and a path search can be made by a retreat to search for a right path. Then, a prior decoded output is read out from the path memory, and at the same time, a prior received symbol is read from the symbol memory and the decision about the right path can be made by the maximum likelihood path decision circuit.

A sequential decoding is carried out by this decision of the maximum likelihood path, and thus the decoded output by which the errors are corrected is fetched from a path memory to the output thereof.

The received symbol which is applied to a symbol memory, is written in response to a write address which is stepped in sequence, and the write address is stepped according to the processing of the decision of the maximum likelihood path. During a reverse path search the read address is reversed, but when a search for the right path is made, the read address is shifted to a forward path search and thus the processing takes a long time. Accordingly, when a concentrated error of the received symbol occurs, the number of not-yet-processed received symbols increases step by step. As the memory capacity of the symbol memory is finite, if the number of the not-yet-processed received symbols increases, there is little room left to write a newly received symbol and an overflow state occurs that may destroy the not-yet-processed received symbol. Because of the overflow, which requires too much time for search, the not-yet-processed received symbol malfunctions and the decoding processing of the symbols can not be maintained, since the write operation proceeds too fast and the data to be read is destroyed before being read.

In a sequential decoder in accordance with the present invention, when the symbol memory is in an overflow state as a result of the concentration of errors of the received symbol, the decoding processing based on the decision of the maximum likelihood path between the symbol segments, which often commits a grave error, is devised to produce a skip thereof.

Figure 6:
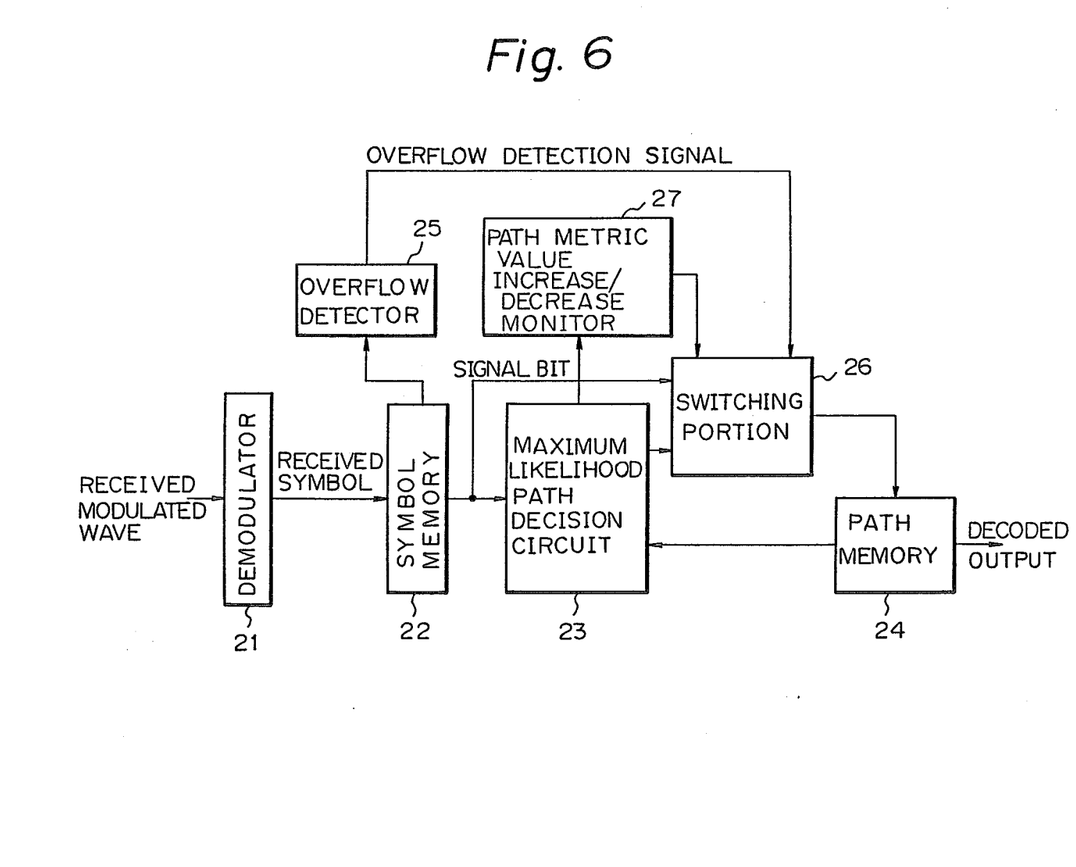
FIG. 6 is a diagram of a sequential decoding device according to an embodiment of the present invention.

FIG. 6 is a block diagram showing the demodulator and sequential decoding device of the present invention. In FIG. 6, reference numeral 21 denotes a demodulator, 22 a symbol memory, 23 a maximum likelihood path decision circuit, 24 a path memory, 25 an overflow detector, 26 a switching portion, and 27 a path metric value increase/decrease monitoring circuit.

The received modulated wave is demodulated in a demodulator 21 to obtain a received symbol, which is then stored in a symbol memory 22. The received symbol is used to determine the maximum likelihood path, based upon whether or not it is correct in the maximum likelihood path decision circuit 23.

In a sequential decoder for decoding the systematic code which is provided with a symbol memory 22, a maximum likelihood path decision circuit 23 and a path memory 24, an overflow detector 25 is connected with the symbol memory 22. When the sequential decoder is subject to frequent transmission errors, the overflow detector 25 detects that the symbol memory 22 is in an overflow state. The signal bit read from the symbol memory 22 is applied to the path memory 24 as a decoding output by means of the overflow detection signal of the overflow detector 25 and the error-rich symbol section is skipped by a switching portion 26. The operation of the path metric value increase/decrease monitoring circuit is to monitor the increase or decrease of a path metric value which is output from the maximum likelihood path decision circuit 23. If the error of received symbols is zero or tends to diminish, the path metric value increases monotonously. After detecting the monotonous increase, the path metric value increase/decrease monitor 27 controls the switching portion 26 so that the demodulation output of the maximum likelihood path decision circuit 23 may be applied to the path memory 24.

The sequential decoder as mentioned above is provided with the demodulator 21, the symbol memory 22, the maximum likelihood path decision circuit 23, the path memory 24, the overflow detector 20, the switching portion 26 and the path metric value increase/decrease monitor 27.

The operation of the sequential decoder will be described hereinafter.

A systematic code is composed of signal bits and parity bits. When an overflow state of a symbol memory 22 is detected by an overflow detector 25, the error of signal bits stored in a symbol memory 22 is not corrected, but is applied to a path memory 24 through a switching portion 26 as a decoder output, as it is, to skip the symbol section having many errors. As a result, the received symbol of the symbol memory 22 can be read regardless of the processing in the maximum likelihood decision circuit 23, so the not-processed received symbol does not malfunction. Accordingly, the overflow of the symbol memory 22 based upon the concentration of the errors of the received symbol is prevented and an occurrence of a state wherein the decoding must be stopped can be avoided.

When the received symbol has less errors, the path metric value of the maximum likelihood decision circuit 23 tends to increase monotonously. When the monotonous increase of the path metric value in the skip state as described above is detected by the path metric value increase/decrease monitor circuit 27, the switching portion 26 is controlled to apply a demodulation output from the maximum likelihood path decision circuit 23 to the path memory 24 and the operation proceeds to a normal decoding.

An alternative embodiment of the present invention will be described with reference to FIG. 7.

Figure 7:
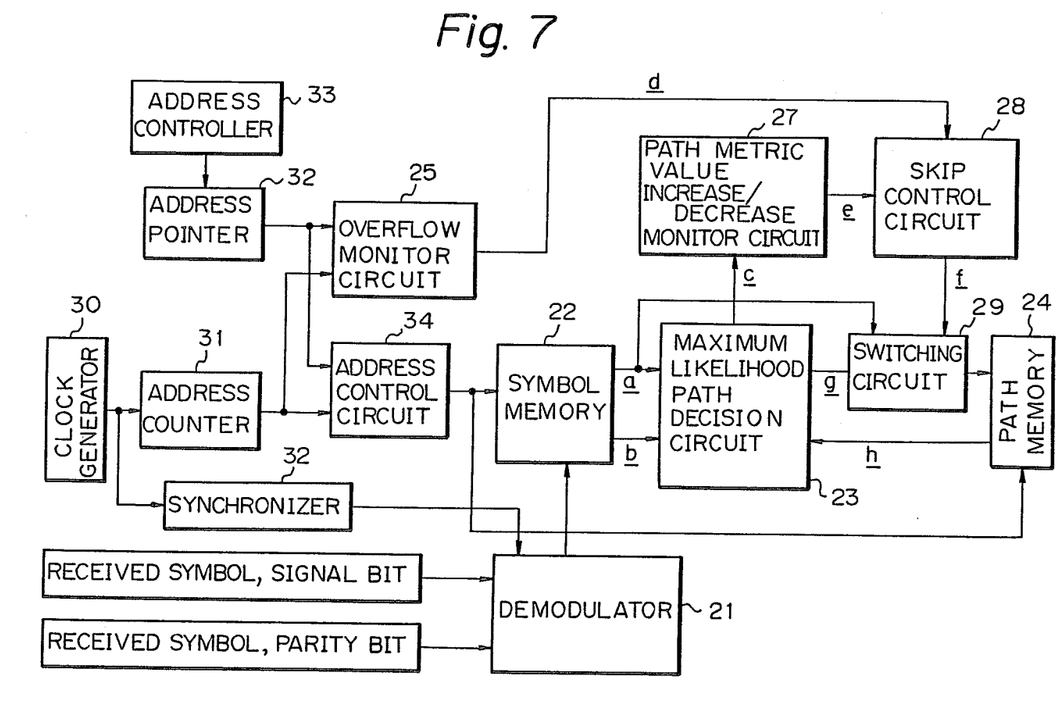
FIG. 7 is a diagram of the detailed structure of the sequential decoding device of FIG. 6.

In FIG. 7, reference numeral 21 denotes a demodulator, 22 a symbol memory, 23 a maximum likelihood path decision circuit, 24 a path memory, 25 an overflow detector, 27 a path metric value increase/decrease monitor, 28 a skip control circuit, 29 a switching circuit, 35 a synchronization circuit, 31 an address counter, 32 an address pointer, 33 an address controller, and 34 an address control circuit. The switching portion 26 in FIG. 6 is replaced by a skip control circuit 28 and a switching circuit 29.

The received modulated wave is demodulated by the demodulator 21 and a received symbol composed of signal bits and parity bits is applied to the symbol memory 22 in synchronization with a clock signal generated by a clock generator 30.

The clock signal is counted by the address counter 31, and the output of the address counter 31 is applied to the symbol memory 22 through the address control circuit 34. The address pointer 32 indicates a head address which reads a received symbol from the symbol memory 22 when the path search is carried out in the maximum likelihood path decision circuit 23. The address pointer 32 is controlled by the address controller 33 in response to the processing of the maximum likelihood path decision circuit 23. The output of the address pointer 32 is applied to the symbol memory 22 through the address control circuit 34 as a head address signal for reading. The address control circuit 34 switches between a write address and a read address and the resultant switching output is applied to the symbol memory 22.

The signal bits a and the parity bits b of the received symbol read from the symbol memory are applied to the maximum likelihood path decision circuit 23. The maximum likelihood path decision circuit 23 calculates a path metric value by using the above-noted received symbol and the decoded signal h corresponding to the constraint length K of a code read from the path memory 24 and compares it with a definite threshold value. When the path metric value exceeds a definite threshold value, it is determined to be a right path and the decoded signal g thereof is applied to the path memory 24 through the switching circuit 29.

When the path metric value does not reach a definite threshold value, it is determined to be a wrong path and a path search is carried out. Then a prior decoded signal h is read from the path memory 24 and a head address from the address pointer 32 is reversed, and accordingly, the prior received symbol is read from the symbol memory 22 and a determination regarding the path metric value is carried out by the maximum likelihood decision circuit. In this processing, the received symbol is written in the symbol memory 22 in sequence.

When a head address pointed out by the address pointer 32 is the same as the address pointed out by the address counter 31, another new received symbol is written in a location in which a not-yet-processed received symbol is stored, so the not-yet-processed received symbol is destroyed. Before this, the overflow detector 25 compares a head address by the address pointer 32 with an address by the address counter 31 to detect an overflow state. The output signal d of the overflow detector 25 is applied to the skip control circuit 28.

The skip control circuit 28 applies a switching control signal f to the switching circuit 29 by the output signal d of the overflow detector 25, and instead of the decoded signal g in which the error is corrected, signal bits a read from the symbol memory 22 are applied to the path memory 24 as a demodulation signal from the maximum likelihood path decision circuit 23, thus skipping the error-concentrated symbol section. In this case, regardless of the demodulation processing in the maximum likelihood path decision circuit 23, reading is carried out in turn from the symbol memory 22 and the not-yet-processed received symbols are reduced and the overflow can be completely avoided. As a result, the signal bit a read from the symbol memory 22 is the demodulation signal which the processing of error correction is not carried out.

The path metric value increase/decrease monitoring circuit 27 monitors the increase/decrease state of the path metric value c in the maximum likelihood path decision circuit 23 and when the path metric value increases monotonously, the increase/decrease state of the path metric value is monitored even in the above-noted skip state, i.e., is monitored in the section in which there are less received symbol errors. Once the monotonous increase of the path metric value is detected, an error correction restarting signal e is applied to the skip control circuit 28. Based upon the error correction restarting signal e, the skip control circuit 28 applies a switching control signal f to the switching circuit 29. A decoded signal g for which an error correction operation is carried out by the maximum likelihood path decision circuit 23 is applied to the path memory 24 to proceed to a normal demodulation processing.

With respect to a systematic code, if there is no error in the signal bit in the reception symbol, the reception symbol is utilized as a reception bit as it is. When the errors of the reception symbol are concentrated, the time of decoding processing due to error correction the maximum likelihood path decision circuit 23 is long, and thus an overflow occurs in the symbol memory 22 and the decoding can not continue to run. But, in such a case, if the signal bit in which the error bit is included is output as a decoded signal as it is, the overflow can be prevented, and then thus the stoppage of the decoding is completely avoided.

The maximum likelihood path decision circuit 23, the overflow detector circuit 25, the path metric value increase/decrease monitoring circuit 27 and the like can be realized by the processing function of a program controlled processor.

With respect to a systematic code, many sorts of values of the constraint length K other than the aforementioned constraint length K=4 may be adopted.

We claim:

1. A sequential decoding device for decoding a data expressed by the systematic code having a symbol memory, a maximum likelihood path decision circuit, and a path memory, said device comprising:

an overflow detection circuit for detecting an overflow of said symbol memory;

switching means for supplying signal bit data, as an decoded output, read from said symbol memory directly to said path memory in correspondence with an overflow detection signal from said overflow detection circuit; and a path metric value increase/decrease monitoring circuit for monitoring the increase/decrease of a path metric value delivered from said maximum likelihood path decision circuit and controlling said switching means in such manner that, when a monotonous increase of said path metric value is detected, the decoded output of said maximum likelihood path decision circuit is supplied to said path memory, instead of the direct supply of said decoded output of said symbol memory to said path memory.

* * * * *